United States Patent [19]

Engdahl

[11] 4,310,363
[45] Jan. 12, 1982

[54] SEALED ELECTRIC PASSAGES

[75] Inventor: Jean Engdahl, Bienne, Switzerland

[73] Assignee: Societe Suisse pour l'Industrie Horlogere Management Services S.A., Bienne, Switzerland

[21] Appl. No.: 762,224

[22] Filed: Jan. 24, 1977

Related U.S. Application Data

[63] Continuation-in-part of Ser. No. 576,172, May 9, 1975, abandoned.

[30] Foreign Application Priority Data

May 20, 1974 [CH] Switzerland ................ 6872/74

[51] Int. Cl.³ .............................. B32B 15/04
[52] U.S. Cl. ............................. 148/31.5; 427/96; 428/472; 428/583; 428/629
[58] Field of Search ............ 179/111 R, 111 E; 307/88 ET; 428/629, 472, 583, 607; 75/20 R, 20 F; 148/1.5; 252/62.3 BT, 62.3 E; 264/61; 106/73.3; 156/89; 361/410, 414, 418; 357/61; 427/96

[56] References Cited

U.S. PATENT DOCUMENTS

| | | | |
|---|---|---|---|
| 2,289,211 | 7/1942 | Ridgway | 106/73.3 |
| 2,696,651 | 12/1954 | Gravley | 106/73.3 |
| 2,899,344 | 8/1959 | Atalla et al. | 148/1.5 |
| 2,989,482 | 6/1961 | Miller | 148/1.5 |
| 3,044,147 | 7/1962 | Armstrong | 148/1.5 |
| 3,390,012 | 6/1968 | Haberecht | 174/152 GM |
| 3,423,517 | 1/1969 | Arrhenius | 156/89 |
| 3,461,347 | 8/1969 | Lemelson | 361/140 |
| 3,501,342 | 3/1970 | Habercht et al. | 357/61 |
| 3,553,533 | 1/1971 | Haberecht | 357/61 |
| 3,669,768 | 6/1972 | Beadle et al. | 148/1.5 |
| 3,770,529 | 11/1973 | Anderson | 156/89 |
| 3,893,230 | 7/1975 | Stadler et al. | 156/89 |
| 3,916,071 | 10/1975 | Kinnebrew et al. | 428/389 |
| 3,948,706 | 4/1976 | Schmeckenbecher | 156/89 |
| 3,965,552 | 6/1976 | Rutt | 427/96 |

FOREIGN PATENT DOCUMENTS 1115721 10/1961 Fed. Rep. of Germany ........ 427/58

Primary Examiner—Michael L. Lewis
Attorney, Agent, or Firm—Griffin, Branigan & Butler

[57] ABSTRACT

A process for obtaining sealed electric passages through an insulating body involves subjecting a titanium oxide ceramic forming a portion of the insulating body to a reduction process at selected places where the passages are desired. The reduction process involves baking the titanium oxide ceramic in a reducing atmosphere. According to some embodiments of the invention, more of the ceramic portion than is necessary is first subjected to the reduction process and those surface portions that are not intended to be conductive are treated to have metallic traces removed therefrom.

9 Claims, 6 Drawing Figures

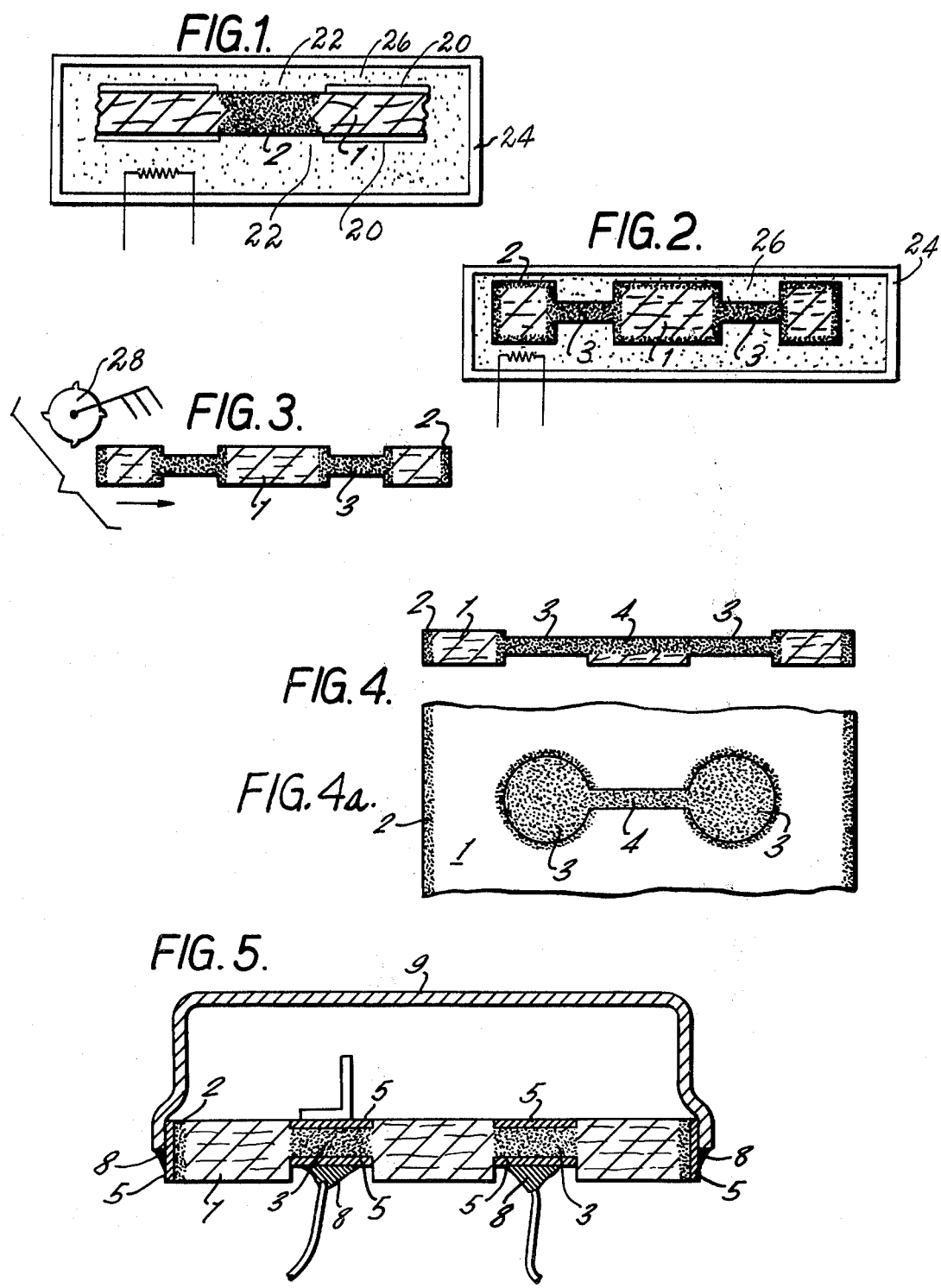

SEALED ELECTRIC PASSAGES

This is a continuation-in-part application of application Ser. No. 576,172, filed May 9, 1975 for PROCESS FOR THE OBTAINING OF SEALED ELECTRIC PASSAGES AND PASSAGES OBTAINED BY SUCH PROCESS by Jean Engdahl and now abandoned.

BACKGROUND OF THE INVENTION

This invention relates to a process for obtaining sealed electric passages within insulating bodies formed at least partially from a metallic oxide. Such sealed passages form electrical connections between elements placed on either side of a wall and traverse the insulator forming such wall in a manner such that no mass transfer may occur between the media located on either side of the wall. The degree of sealing required here is that which is found in vacuum techniques such as is used in radio or television tubes, light bulbs and relays operating under vacuum or within special atmospheres.

The prior art includes three known methods for obtaining such passages which respond to the requirements:

(1) Embedding the conductors in a thermoplastic or thermosetting insulation, resin or synthetic rubber, etc.

(2) Providing the passages through a metallic member the conductors being then fastened thereto by glass beads.

(3) Providing the passages in an insulating member of glass or ceramic provided with metallized holes in which the conductors are fixed by soldering or brazing.

The first of these methods is often insufficient since most plastic materials or other synthetic insulators exhibit generally either an undesirable porosity or the capacity to absorb gas or vapor.

The second solution is faced with the difficulty of adapting the thermal expansion coefficients of the metals and glasses used. Such passages are moreover very sensitive to mechanical stress.

The third among these prior art solutions is particularly difficult to use since the solder and brazing materials have coefficients of expansion generally much higher than glass and ceramic and only through adoption of a special assembly geometry will it be possible to obtain an acceptable result.

This invention has for its object to provide a process for obtaining electric passages which are completely sealed and enable the avoidance of the previously-mentioned difficulties without requiring the collecting and assembling of elements of a different nature.

SUMMARY

Such passages are obtained in an insulating body formed for the most part by a metallic oxide which is locally subjected to a reducing process at regions desired for the passages, such reduction transforming the body throughout its thickness to a metal-like state so that a conductive path is provided between the two faces of the insulator.

In a preferred embodiment of the invention the insulator has zones of lesser thickness at places for which the passages are desired and the reducing process extends over the entire surface of the insulator thus establishing metallic connections between the two faces, the insulator thus treated being subsequently machined so as to remove every metal-like trace outside the original zones of lesser thickness.

BRIEF DESCRIPTION OF THE DRAWINGS

For a better understanding of the description, reference will now be made to the drawings among which FIG. 1 is a partially cutaway cross sectional view of an insulating plate provided with a conductive zone obtained by a process according to the invention;

FIGS. 2 and 3 are cross sectional views of one embodiment of the invention respectively at intermediate and final stages thereto;

FIGS. 4 and 4a are plan and cross sectional views of two passages joined on one surface by a conductor bridge obtained during the same processing step; and FIG. 5 is a cross sectional view of one possibility of a mounting arrangement for applying the invention.

DESCRIPTION OF PREFERRED EMBODIMENTS

Among insulating materials applied in electrotechnology ceramic materials provide the advantage of being able to be press molded, to be completely impermeable and to give a strength well superior to that of glass. Generally they comprise an agglomeration of crystal grains the adherence there among being provided by a bonding material, often a glass.

Most ceramics normally employed as base material use a metallic oxide. By heating in a reducing atmosphere it is possible to make certain of these ceramics superficially conducting. This possibility may be applied in certain cases to avoid accumulation of electrostatic charges. The present invention utilizes this property in order to create conductive zones *through* a member made of a metallic oxide based ceramic.

In a first version of the invention as illustrated by FIG. 1, a thin plate of ceramic 1 is submitted to a reduction process confined to certain corresponding zones on each side of the plate. The depth affected by the chemical transformation is such that the corresponding zones eventually come together thereby assuring an electric connection between the plate's 1 opposite surfaces. A localization of such reduction process may be obtained through the use of a mask to protect the zones which are not to be reduced and therefore remain insulating.

A ceramic 1 particularly well suited to the process as described is titanium oxide $TiO_2$. The oxide and the reduction product effectively have identical expansion coefficients and thereby no thermal stresses arise at an electrical conductive passage zone 2. The material moreover is stable and one to which simple surface treatments may be applied in view of a subsequent welding or soldering operation to connections or component elements.

For the version of the invention for which a mask 20 is required, such a mask 20 is in the form of a surface layer of refractory metal such as molybdenum or tungsten. The mask may be obtained on the ceramic plate 1 by any of several well-known methods such as chemical vapor deposition from an organo-metallic compound of the metal, or by plasma jet spraying for example.

Describing one mode of manufacturing this first version in more detail, the mask 20 is coated onto both sides of a 3 mm thick, compacted sintered titanium oxide ($TiO_2$) ceramic plate 1, leaving openings 22 opposite one another on the opposite surfaces of the ceramic plate 1. The ceramic plate 1 is positioned in an oven 24 having a reducing dry hydrogen atmosphere 26 therein.

The oven 24 bakes the ceramic at a temperature of 1,000° C. The ceramic plate 1 is subjected to these reducing conditions for around 30 minutes to produce reduction throughout the entire thickness of the ceramic plate 1 at the mask openings 22 to make conductive passage zone 2. However, little or no reduction occurs in the ceramic 1 where the mask 20 is located. Tests indicate that such a process produces an electrical passage 2 having satisfactory electrical conductivity. The mask 20 can be removed later by milling, chemical processes, or the like if it is desired or necessary.

In the preferred embodiment shown by FIGS. 2 and 3 the ceramic plate 1, as seen in cross section, has, prior to a reduction treatment, zones of lesser thickness 3 at places for which the passages are wished. The aforementioned reduction process is provided over the entire plate surface and gives rise to a surface conducting layer 2 of sufficient depth to affect the entire thickness of the insulator within the zones of lesser thickness 3. A polishing or milling, as by a tool 28 for example, is subsequently applied to both surfaces of the plate in order to remove the conductive layer 2 wherever it is necessary to assure the insulating qualities of the ceramic, which is to say everywhere except in the zones of lesser thickness 3.

Describing in more detail a manufacturing process of producing the ceramic plate of FIG. 3 having selective zones of conductivity, the ceramic plate 1 is of compacted sintered $TiO_2$ and, in the blank of FIG. 2, the zones of lesser thickness 3 are approximately 0.6 mm thick while the zones of greater thickness are 3 mm thick. The blank of FIG. 2 is heated in an oven at a temperature of 700° C. while being exposed to a reducing dry hydrogen atmosphere for a period of 20 minutes. Thereafter, at least 0.3 mm are milled off of the surfaces of the zones of greater thickness, by a tool 28 for example, to remove the conductive layer 2 at these zones. The result is the ceramic plate as shown in FIG. 3 having selected zones of conductivity at the zones of lesser thickness 3.

With regard to the ceramic plate dimensions, and the temperature and time required for the reduction process, many combinations are possible. However, the following test results are given as guidelines in practicing this invention.

In a first test, compacted sintered titanium oxide ($TiO_2$) bodies having a thickness of 3 mm were subjected to a temperature of 700° C. in a dry hydrogen-atmosphere during a period of twenty minutes. It was found as a result that a reduction occurred through a surface zone having a thickness of approximately 0.3 mm.

In a second test, bodies of the same composition and dimensions were subjected to a temperature of 1000° C. during a period of thirty minutes likewise in a dry hydrogen atmosphere. In this case reduction occurred through the entire thickness of the bodies.

In both tests the reduced portions showed satisfactory electrical conductivity.

FIGS. 4 and 4a show in cross section and in plan an example of passages obtained by the process previously described and which are additionally connected together on one surface of the plate 1 by a conductive bridge 4. Such bridges may be obtained by providing on one surface only a depression uniting the zones of lesser thickness prior to the reducing operation.

The electric connections of the sealed conductive passages thus obtained to components which are exterior to the ceramic plate may be obtained by various means of which one is shown in FIG. 5. Zones where the reduction has produced a metal-like conductive state are, following polishing, covered over by metallizations 5 deposited by any suitable process. Conductive wires or metallic supports from various components may then be soldered or welded as shown at 8 onto the metallizations. A hermetic encapsulation 9 for components (not shown) may in the same manner be welded or soldered onto the edges of the plate.

The embodiments of the invention in which an excusive property or privilege are claimed are as follows:

1. An insulative body, or panel, constructed initially of a metallic oxide, said insulative body having a sealed electrically-conductive passage surrounded by insulation extending between two faces of said insulative body said passage having been formed by the process of subjecting said metallic oxide of said insulative body at said passage to heating in a reducing atmosphere a sufficient amount of time to reduce the metallic oxide initially present at said passage, and throughout said passage length, to a metal-like electrically conductive state but not the surrounding insulative metallic oxide.

2. An insulative body as claimed in claim 1 wherein said insulative body is constructed of a ceramic material.

3. An insulative body as claimed in claim 2 wherein the ceramic is basically constituted by titanium oxide.

4. An insulative body as claimed in claim 1 wherein said process of forming said insulative body having a sealed passage includes the steps of arranging a zone of lesser thickness on said insulative body at a place desired for an electrical conductive passage and applying said reduction process over the entire surface of the insulative material so as to establish in the zone of lesser thickness a metal-like electric connection between the two faces of the insulative body but, outside of the zone of lesser thickness, to only establish reduced metal-like conductive surface traces, said process including the further step of removing said reduced metal-like surface traces from the insulative body outside of the zone of lesser thickness, thereby leaving the zone of lesser thickness as an electric passage surrounded by insulation.

5. An insulative body as in claim 4 wherein said insulative body is formed of a ceramic.

6. An insulative body as in claim 1 wherein said process of forming said insulative body having a sealed passage includes the steps of:
   masking opposite sides of said insulative body but leaving openings in said masks opposite one another; and,
   thereafter heating said openings in said masks at said reducing temperature in said reducing atmosphere a sufficient amount of time to reduce the insulative body across its thickness at said openings to thereby create said sealed metal-like electric passage surrounded by insulation at said openings in said masks.

7. An insulative body as in claim 6 wherein said insulative body is formed substantially of titanium oxide ($TiO_2$), said masks are formed of refractory metals from the group of molybdenum and tungsten, and said heat is applied thereto at a temperature of 1000° C. for a time of 30 minutes.

8. An insulative body as in claim 1 wherein said insulative body further includes a first means coupled to said sealed electrically-conductive passage on a first side of said insulative body for electrically coupling a component to said sealed electrically-conductive passage on said first side; and, a second means coupled to said sealed electrically-conductive passage on the opposite side of said insulative body for electrically coupling a means to energize said electrical component to said sealed electrically-conductive passage on said opposite side.

9. An insulative body as in claim 1 wherein said insulative body is formed substantially of titanium oxide ($TiO_2$) and said heat is applied at a temperature of 700° for a time of 30 minutes.

* * * * *